US010234645B2

(12) United States Patent
Ishige et al.

(10) Patent No.: US 10,234,645 B2
(45) Date of Patent: Mar. 19, 2019

(54) SEMICONDUCTOR LASER MODULE AND THREE-DIMENSIONAL LAMINATING AND SHAPING APPARATUS

(71) Applicant: TECHNOLOGY RESEARCH ASSOCIATION FOR FUTURE ADDITIVE MANUFACTURING, Tokyo (JP)

(72) Inventors: Yuta Ishige, Chiba (JP); Etsuji Katayama, Chiba (JP); Hajime Mori, Chiba (JP)

(73) Assignee: TECHNOLOGY RESEARCH ASSOCIATION FOR FUTURE ADDITIVE MANUFACTURING, Tokyo (JP)

( * ) Notice: Subject to any disclaimer, the term of this patent is extended or adjusted under 35 U.S.C. 154(b) by 0 days.

(21) Appl. No.: 15/513,371

(22) PCT Filed: Sep. 14, 2016

(86) PCT No.: PCT/JP2016/077102
§ 371 (c)(1),
(2) Date: Mar. 22, 2017

(87) PCT Pub. No.: WO2018/051430
PCT Pub. Date: Mar. 22, 2018

(65) Prior Publication Data
US 2018/0231724 A1 Aug. 16, 2018

(51) Int. Cl.
*G02B 6/42* (2006.01)
*H01S 5/022* (2006.01)
(Continued)

(52) U.S. Cl.
CPC ............. *G02B 6/4273* (2013.01); *G02B 6/42* (2013.01); *G02B 6/4237* (2013.01);
(Continued)

(58) Field of Classification Search
None
See application file for complete search history.

(56) References Cited

U.S. PATENT DOCUMENTS

| 6,843,607 B2 * | 1/2005 | Nakanishi ............ G02B 6/4246 385/14 |
| 7,068,690 B2 | 6/2006 | Okazaki et al. |

(Continued)

FOREIGN PATENT DOCUMENTS

| JP | 6-138351 A | 5/1994 |
| JP | 2003-142767 A | 5/2003 |

(Continued)

OTHER PUBLICATIONS

English translation of written opinion for PCT/JP2016/077102, dated Nov. 15, 2016.*

(Continued)

*Primary Examiner* — Michael Stahl
(74) *Attorney, Agent, or Firm* — Ladas & Parry LLP (57) ABSTRACT

A variation in coupling ratio of output light from a laser element to an optical fiber is suppressed. A semiconductor laser module including a plurality of semiconductor laser elements, an optical fiber, a condenser that condenses a laser beam emitted from each of the semiconductor laser elements to the optical fiber, and a housing that implements the laser elements, the condenser, and the optical fiber includes at least one thin plate that is arranged between the laser elements and a top of the housing, and arranged on the top to form a gap with the top.

13 Claims, 11 Drawing Sheets

(51) Int. Cl.
  *H01S 5/024* (2006.01)
  *G02B 19/00* (2006.01)
  *G02B 27/09* (2006.01)
  *H01S 5/40* (2006.01)
  *B22F 3/105* (2006.01)
  *H01S 5/00* (2006.01)
  *B29C 64/153* (2017.01)
  *B29C 64/268* (2017.01)

(52) U.S. Cl.
  CPC ......... *G02B 6/4256* (2013.01); *G02B 6/4266* (2013.01); *G02B 6/4296* (2013.01); *G02B 19/0004* (2013.01); *G02B 27/09* (2013.01); *H01S 5/022* (2013.01); *H01S 5/024* (2013.01); *H01S 5/02216* (2013.01); *H01S 5/02284* (2013.01); *H01S 5/02438* (2013.01); *H01S 5/02469* (2013.01); *H01S 5/405* (2013.01); *B22F 3/1055* (2013.01); *B22F 2999/00* (2013.01); *B29C 64/153* (2017.08); *B29C 64/268* (2017.08); *G02B 6/4204* (2013.01); *H01S 5/005* (2013.01); *H01S 5/0071* (2013.01); *H01S 5/02252* (2013.01); *H01S 5/4012* (2013.01); *H01S 5/4056* (2013.01)

(56) References Cited

U.S. PATENT DOCUMENTS

| | | | |
|---|---|---|---|
| 7,226,222 B2 | 6/2007 | Nagano et al. | |
| 2003/0095346 A1* | 5/2003 | Nasu | G02B 6/4208 359/820 |
| 2004/0027631 A1* | 2/2004 | Nagano | G02B 6/4206 372/36 |
| 2005/0281506 A1 | 12/2005 | Okazaki et al. | |
| 2006/0215966 A1 | 9/2006 | Nagano et al. | |
| 2012/0288242 A1 | 11/2012 | Nishizawa et al. | |
| 2012/0320938 A1 | 12/2012 | Takenaka | |
| 2014/0241673 A1 | 8/2014 | Chan | |
| 2015/0183060 A1 | 7/2015 | Nishizawa et al. | |
| 2015/0280404 A1* | 10/2015 | Kasai | G02B 27/10 385/33 |
| 2016/0181762 A1* | 6/2016 | Dawson | H01S 5/02469 372/6 |
| 2016/0246022 A1* | 8/2016 | Ishige | G02B 6/4206 |
| 2017/0153400 A1* | 6/2017 | Kasai | G02B 6/42 |

FOREIGN PATENT DOCUMENTS

| | | | | |
|---|---|---|---|---|
| JP | 2004-6440 A | | 1/2004 | |
| JP | 2004-96088 A | | 3/2004 | |
| JP | 2004-109313 A | * | 4/2004 | |
| JP | 2012-70007 A | | 4/2012 | |
| JP | 2016-71005 A | | 5/2016 | |
| JP | 2016-189430 A | * | 11/2016 | |
| WO | 2016/051866 A1 | | 4/2016 | |

OTHER PUBLICATIONS

International Search Report (ISR) and Written Opinion (WO) dated Nov. 15, 2016 for International Application No. PCT/JP2016/077102.
J-PlatPat English abstract of JP 2004-96088 A.
J-PlatPat English abstract of JP 2004-6440 A.
J-PlatPat English abstract of JP 2016-71005 A.
J-PlatPat English abstract of JP 2012-70007 A.
Japanese Office Action dated Jan. 4, 2018 for Japanese Application No. 2017-514583.
Decision to Grant a Patent dated Jul. 26, 2018 mailed in connection with corresponding Japanese Patent Application No. JP 2017-514583.
J-PlatPat English abstract of JP 6-138351 A.
J-PlatPat English abstract of JP 2003-142767 A.
Supplementary European Search Report (SESR) dated Sep. 21, 2018 in connection with corresponding European Application No. 16 885 450.3.

* cited by examiner

SEMICONDUCTOR LASER MODULE AND THREE-DIMENSIONAL LAMINATING AND SHAPING APPARATUS

RELATED APPLICATION

This application is an application under 35 U.S.C. 371 of International Application No. PCT/JP2016/077102 filed on Sep. 14, 2016, the entire contents of which are incorporated herein by reference.

TECHNICAL FIELD

The present invention relates to a semiconductor laser module and a three-dimensional laminating and shaping apparatus.

BACKGROUND ART

In the above technical field, patent literature 1 discloses a technique of condensing a laser beam emitted from a semiconductor laser element through a lens, coupling it to an optical fiber, and externally emitting the laser beam.

CITATION LIST

Patent Literature

Patent literature 1: Japanese Patent Laid-Open No. 2004-96088

SUMMARY OF THE INVENTION

Technical Problem

In the technique described in the above literature, however, it is impossible to suppress a variation in coupling ratio of output light from a semiconductor laser element to an optical fiber.

The present invention enables to provide a technique of solving the above-described problem.

Solution to Problem

One aspect of the present invention provides a semiconductor laser module including a plurality of semiconductor laser elements, an optical fiber, a condenser that condenses a laser beam emitted from each of the semiconductor laser elements to the optical fiber, and a housing that implements the laser elements, the condenser, and the optical fiber, the semiconductor laser module comprising:

at least one thin plate that is arranged between the laser elements and a top of the housing, and arranged on the top to form a gap with the top.

Another aspect of the present invention provides a three-dimensional laminating and shaping apparatus using the above-described semiconductor laser module.

Advantageous Effects of Invention

According to the present invention, it is possible to suppress a variation in coupling ratio of output light from a semiconductor laser element to an optical fiber.

DESCRIPTION OF EXAMPLE EMBODIMENTS

Example embodiments of the present invention will now be described in detail with reference to the drawings. It should be noted that the relative arrangement of the components, the numerical expressions and numerical values set forth in these example embodiments do not limit the scope of the present invention unless it is specifically stated otherwise.

First Example Embodiment

A semiconductor laser module 100 according to the first example embodiment of the present invention will be described with reference to FIG. 1. The semiconductor laser module 100 is an apparatus for condensing a laser beam emitted from a semiconductor laser element through a condenser lens to enter an optical fiber, and irradiating a target outside the module with the laser beam.

<Technical Premise>

Figure 3A:
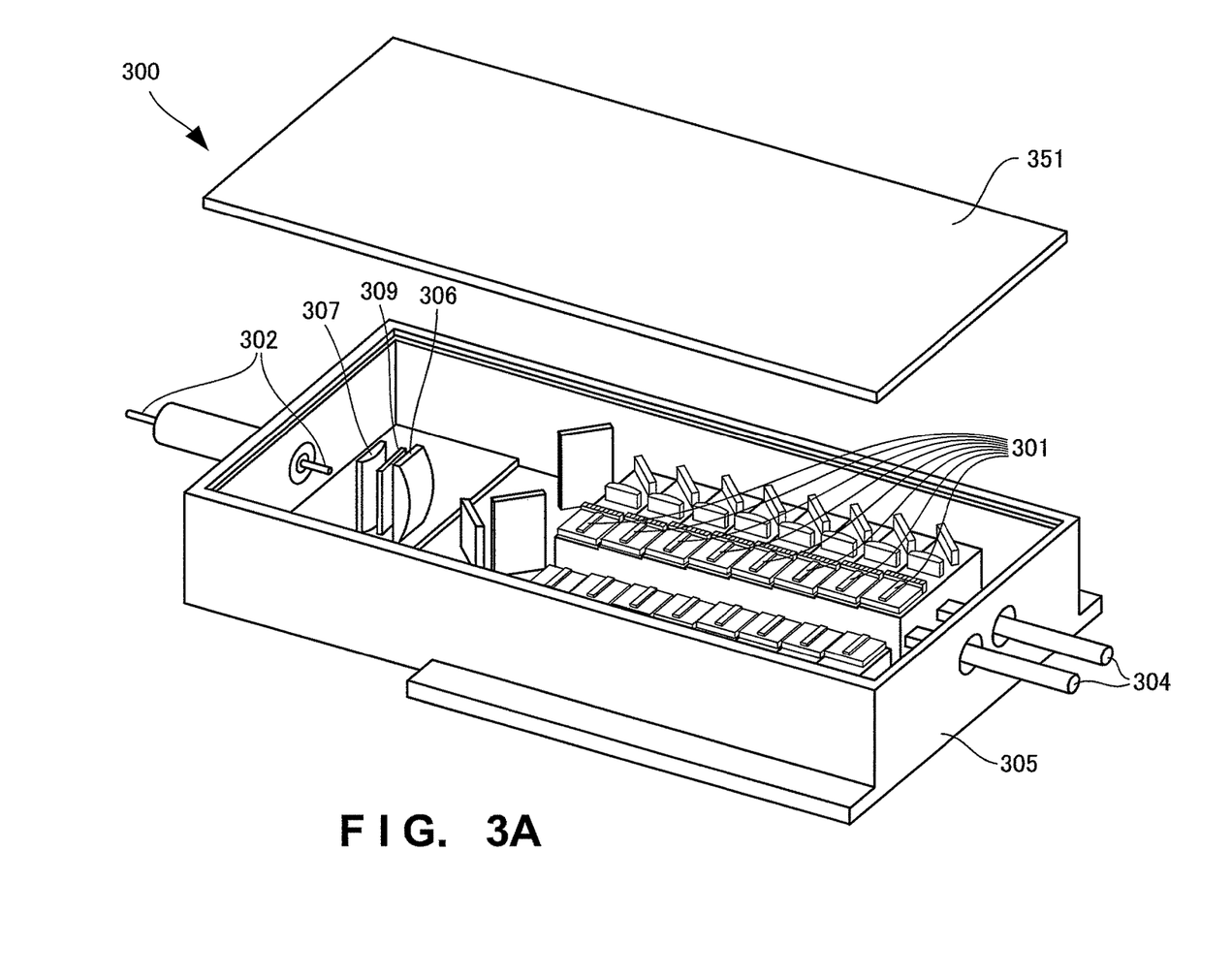
FIG. 3A is a schematic perspective view showing the arrangement of a semiconductor laser module according to a technical premise of the semiconductor laser module according to the first example embodiment of the present invention.
Figure 3B:
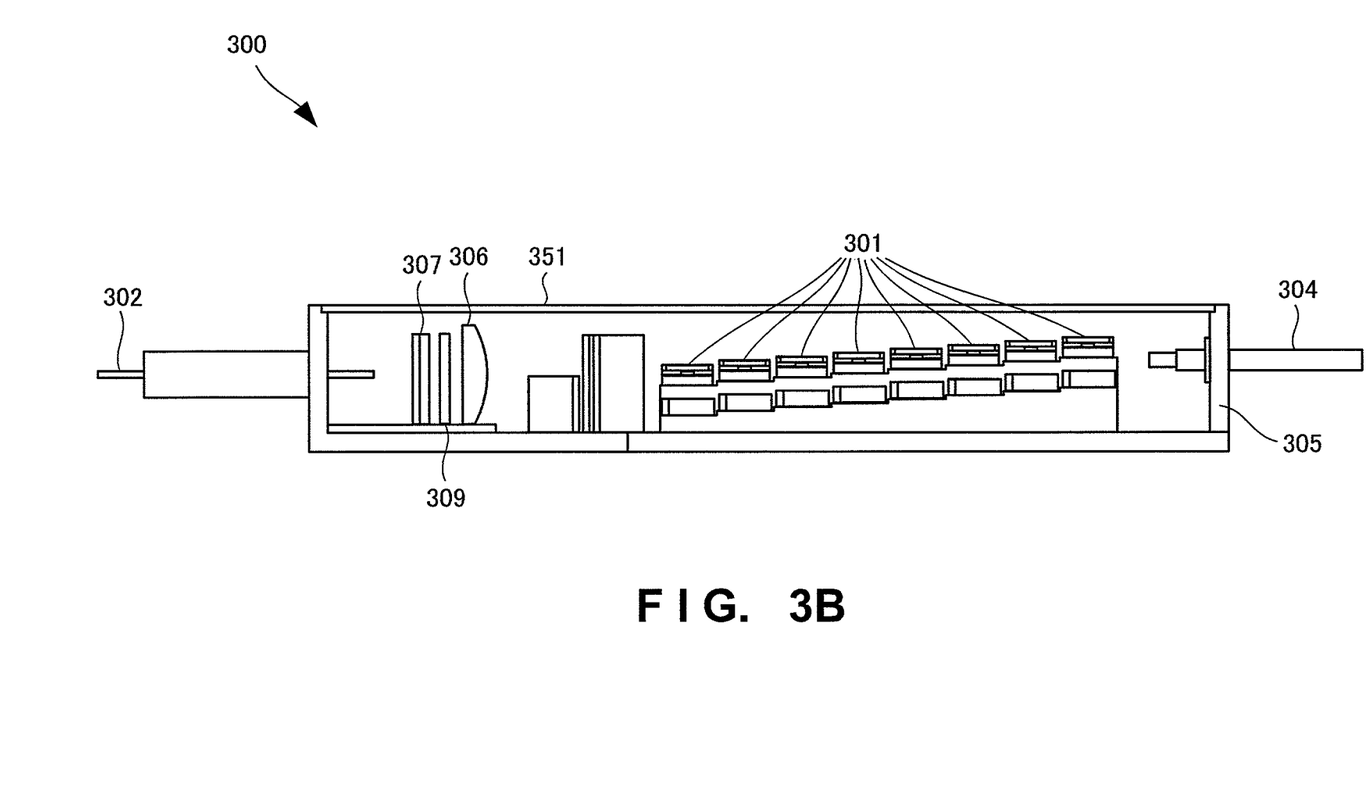
FIG. 3B is a schematic side view showing the arrangement of the semiconductor laser module according to the technical premise of the semiconductor laser module according to the first example embodiment of the present invention.

A semiconductor laser module 300 according to a technical premise of the semiconductor laser module according to this example embodiment will be described with reference to FIGS. 3A and 3B. FIG. 3A is a schematic perspective view showing the arrangement of the semiconductor laser module 300 according to the technical premise of the semiconductor laser module according to this example embodiment. FIG. 3B is a schematic side view showing the arrangement of the semiconductor laser module 300 according to the technical premise of the semiconductor laser module according to this example embodiment.

The semiconductor laser module 300 includes a plurality of semiconductor laser elements 301, an optical fiber 302, lead pins 304, a housing 305, lenses 306 and 307, and an optical filter 309. The plurality of semiconductor laser elements 301, optical fiber 302, lead pins 304, lenses 306 and 307, and optical filter 309 are accommodated and implemented in the housing 305, thereby forming the semiconductor laser module 300.

The housing 305 includes a top 351. Note that in the use state of the semiconductor laser module 300, the top 351 is attached to the housing 305 by adhering, screwing, or the like, thereby sealing the housing 305. The interior of the housing 305 is sealed, and thus the internal structure of the semiconductor laser module 300 cannot be seen from the outside. The semiconductor laser module 300 has a structure for preventing dust from entering the housing 305. The semiconductor laser module 300 condenses a laser beam emitted from each of the plurality of semiconductor laser elements 301, and irradiates an external target with the laser beam.

The semiconductor laser element 301 is a high-output semiconductor laser element, and emits, for example, a high-output laser beam of 10 W or more. For example, the semiconductor laser element 301 emits a laser beam having a wavelength of 900 nm to 1,000 nm. Furthermore, if it is desirable to raise the output of the laser beam emitted from the semiconductor laser module 300, this is implemented by increasing the number of semiconductor laser elements 301 or raising the output of each semiconductor laser element 301.

The optical fiber 302 is, for example, a multi-mode optical fiber having a predetermined core diameter and cladding diameter. The present invention, however, is not limited to this, and a single-mode optical fiber may be used. The numerical aperture (NA) of the optical fiber 302 falls within, for example, the range of 0.15 to 0.22. The present invention, however, is not limited to this.

Each lead pin 304 supplies power to the semiconductor laser elements 301 via a boding wire (not shown). Power may be supplied to the semiconductor laser elements 301 at a constant voltage or modulation voltage.

Each of the lenses 306 and 307 is, for example, a cylindrical lens, and condenses a laser beam emitted from each semiconductor laser element 301, and couples it to the optical fiber 302. The arrangement positions of the lenses 306 and 307 with respect to the optical fiber 302 are adjusted so that the laser beam emitted from each semiconductor laser element 301 is coupled to the optical fiber 302 at a predetermined coupling ratio.

The optical filter 309 is arranged between the lenses 306 and 307 and the optical fiber 302. If the semiconductor laser module 300 is used as, for example, an excitation light source of a fiber laser, this filter 309 is arranged for the purpose of blocking return light which enters the semiconductor laser module 300 from the fiber laser. The optical filter 309 is a low-pass filter, and reflects a laser beam having a wavelength of 1,060 nm to 1,080 nm and transmits a laser beam having a wavelength of 900 nm to 1,000 nm. Therefore, the optical filter 309 prevents each semiconductor laser element 301 from being irradiated with a laser beam having a wavelength of 1,060 nm to 1,080 nm from the outside of the semiconductor laser module while transmitting a laser beam emitted from the semiconductor laser element 301. The optical filter 309 is arranged to form an angle with the optical axis of a laser beam reflected by the optical filter 309 so the laser beam does not return to the optical fiber 302.

In the semiconductor laser module 300 having the above-described arrangement, the top 351, side walls, bottom surface, and the like of the housing 305 are irradiated with light leaking from the end face of each semiconductor laser element 301, light not entering the optical fiber 302, or the like as stray light. A portion irradiated with stray light or the like is heated to raise its temperature.

The semiconductor laser element 301 itself generates heat, and the heat is transferred to the top 351, side walls, bottom surface, and the like, thereby heating the top 351 and the like. The bottom surface portion and side wall portions of the housing 305 are connected to a cooling medium such as a heat sink. Even if, therefore, stray light hits the bottom surface portion and side wall portions, heat can be emitted to the heat sink side, thereby making it difficult to raise the temperature.

On the other hand, the top 351 is far from the heat sink, and has a high thermal resistance. Thus, if the top 351 is irradiated with stray light or the like, it is heated to raise its temperature, and thus extends and expands. If, for example, the top 351 extends, the whole housing 305 is distorted.

Adjustment for guiding the laser beam to the optical fiber 302 is very severe. Thus, if the housing 305 is distorted even slightly, the condensing position of the laser beam to the optical fiber 302 shifts. As a result, the coupling ratio of the laser beam emitted from the semiconductor laser element 301 to the optical fiber 302 changes, and the amount of light exiting from the semiconductor laser module 300 changes, thereby changing (decreasing) the output of the laser beam.

<Technique of Example Embodiment>

Figure 1:
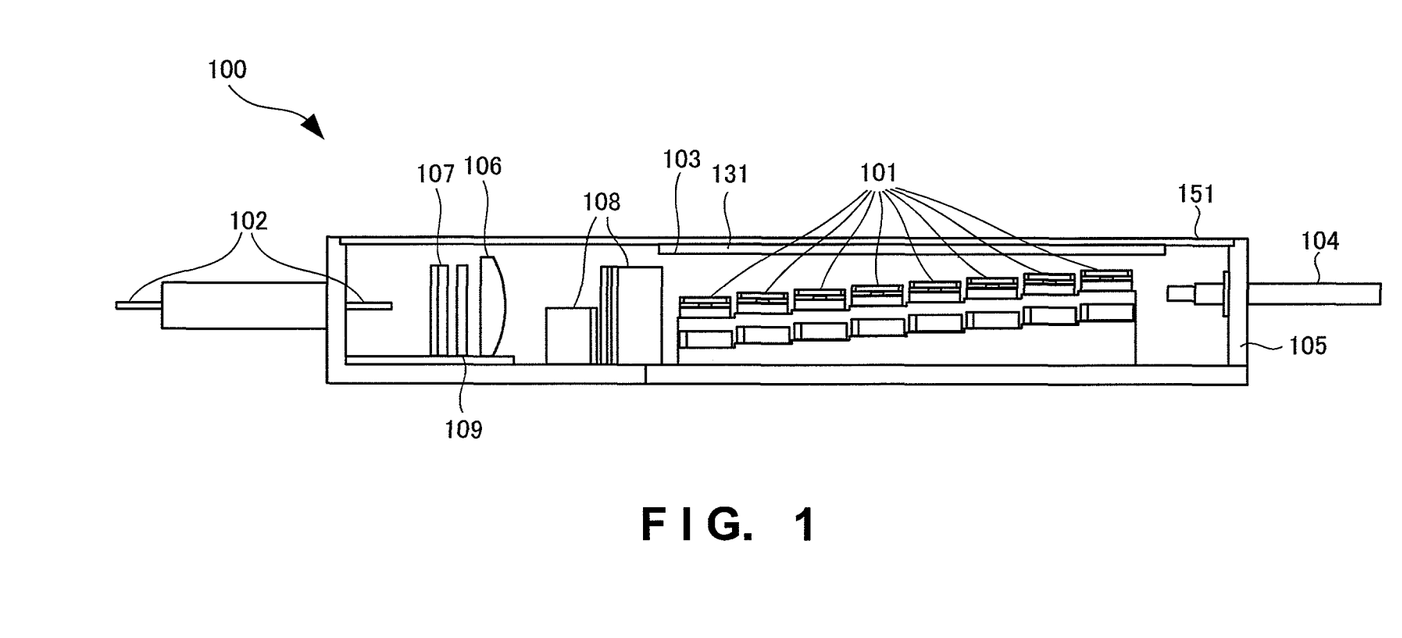
FIG. 1 is a schematic side view showing the arrangement of a semiconductor laser module according to the first example embodiment of the present invention.
Figure 2A:
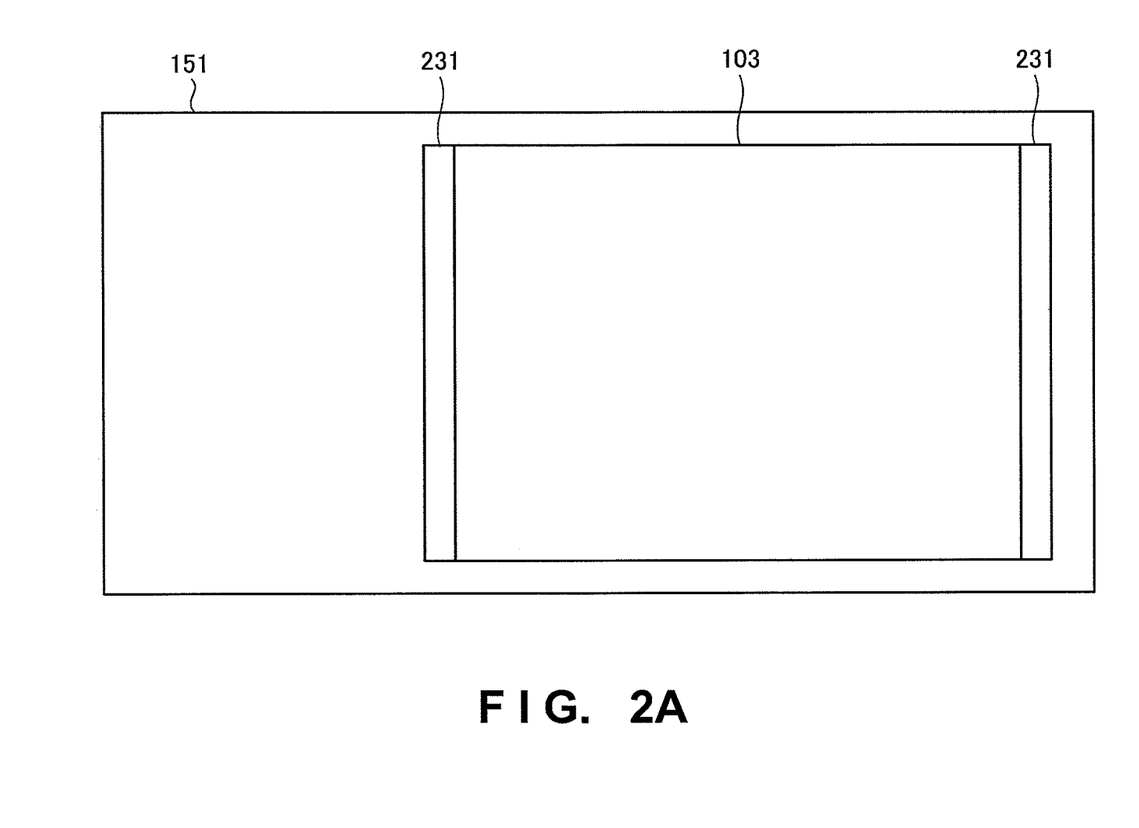
FIG. 2A is a plan view showing an example of the arrangement of the top and thin plate of the semiconductor laser module according to the first example embodiment of the present invention.
Figure 2B:
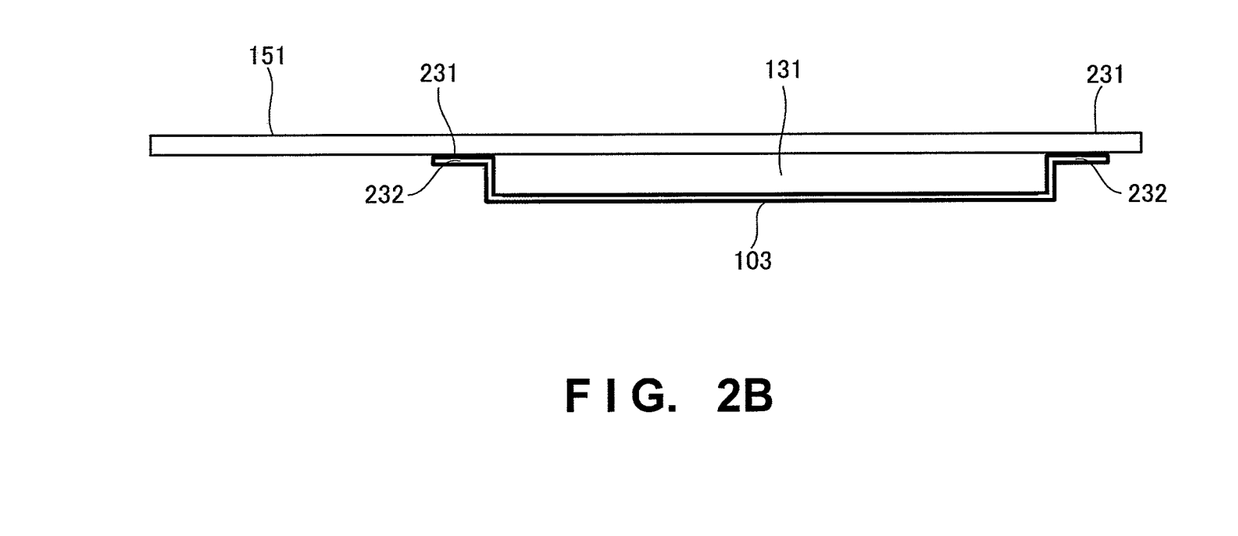
FIG. 2B is a partially enlarged side view showing the example of the arrangement of the top and thin plate of the semiconductor laser module according to the first example embodiment of the present invention.
Figure 2C:
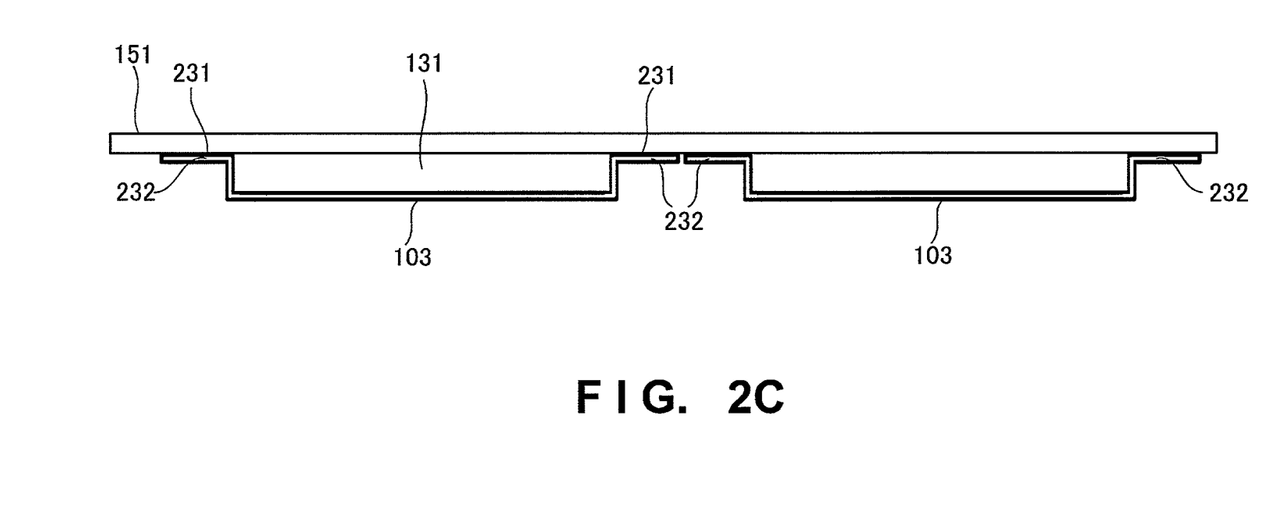
FIG. 2C is a partially enlarged side view showing an example of the arrangement of the thin plates of the semiconductor laser module according to the first example embodiment of the present invention.
Figure 2D:
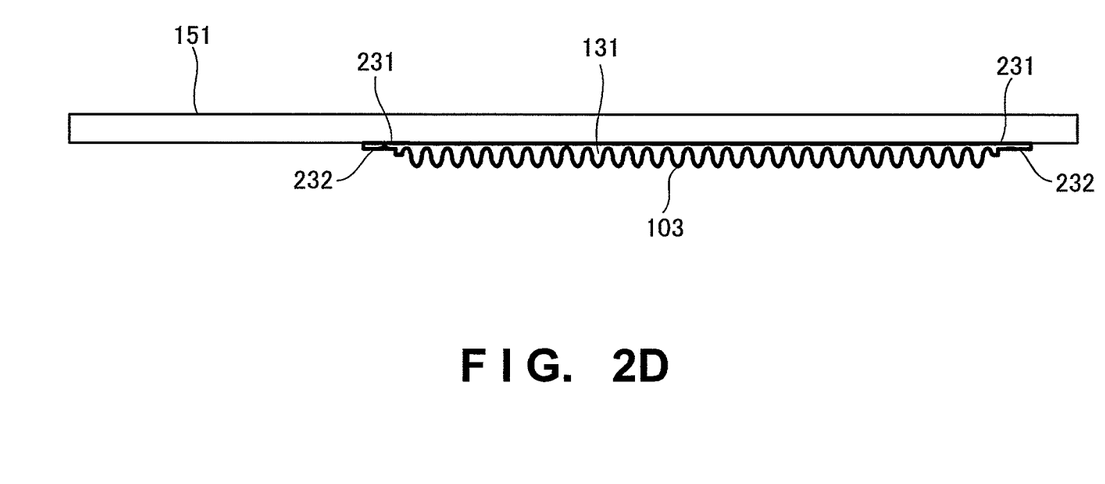
FIG. 2D is a partially enlarged side view showing another example of the arrangement of the thin plate of the semiconductor laser module according to the first example embodiment of the present invention.
Figure 2E:
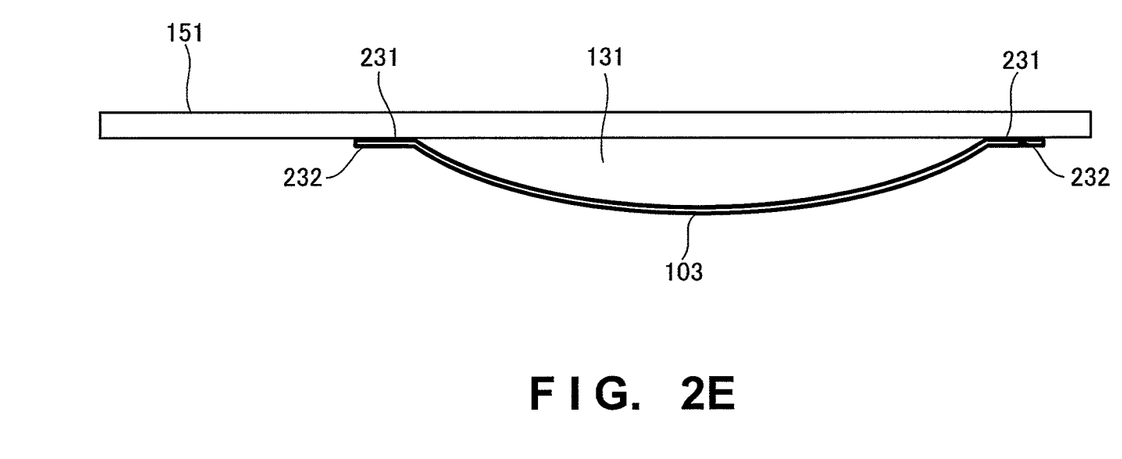
FIG. 2E is a partially enlarged side view showing still other example of the arrangement of the thin plate of the semiconductor laser module according to the first example embodiment of the present invention.
Figure 2F:
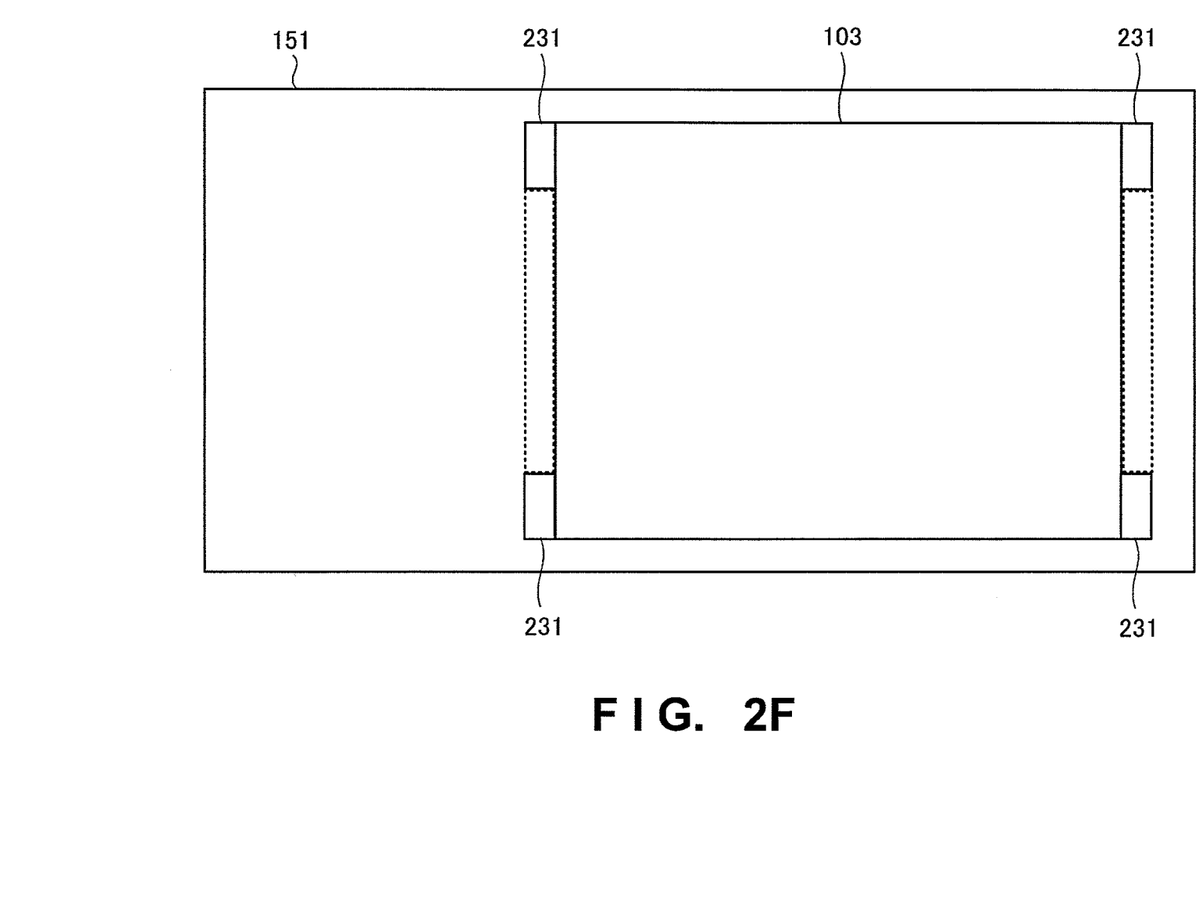
FIG. 2F is a plan view showing an example of the arrangement of the fixing portions of the thin plate of the semiconductor laser module according to the first example embodiment of the present invention.
Figure 2G:
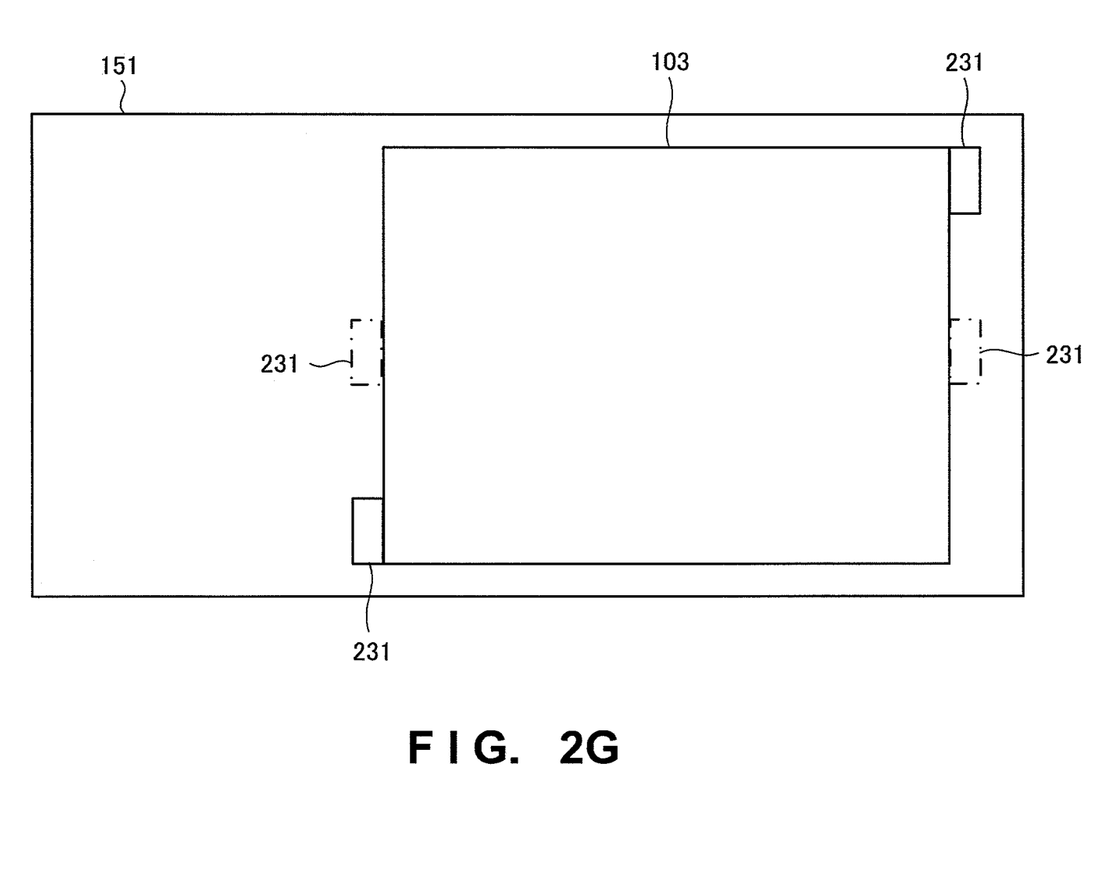
FIG. 2G is a plan view showing another example of the arrangement of the fixing portions of the thin plate of the semiconductor laser module according to the first example embodiment of the present invention.

A semiconductor laser module according to this example embodiment will be described with reference to FIGS. 1 to 2G FIG. 1 is a schematic side view for explaining the arrangement of the semiconductor laser module 100 according to this example embodiment.

As shown in FIG. 1, the semiconductor laser module 100 includes semiconductor laser elements 101, an optical fiber 102, a thin plate 103, a lead pin 104, a housing 105, lenses 106, 107, and 108, and an optical filter 109. The plurality of semiconductor laser elements 101, the optical fiber 102, the lead pin 104, the lenses 106, 107, and 108, and the optical filter 109 are implemented in the housing 105, thereby forming the semiconductor laser module 100.

A laser beam output from each of the semiconductor laser elements 101 is coupled to the optical fiber 102 via an optical system formed by including the lenses 106, 107, and 108 and optical filter 109 in the housing 105. The laser beam coupled to the optical fiber 102 exits to the outside of the semiconductor laser module 100.

The thin plate 103 is arranged in the housing 105, and attached on the inner surface side of a top 151. More specifically, the thin plate 103 is provided between the semiconductor laser elements 101 and the top 151, that is, at a position facing the semiconductor laser elements 101. A gap 131 is formed between the thin plate 103 and the top 151. Note that the thin plate 103 may be provided on the inner surface side of the side wall of the housing 105. Furthermore, the thin plate 103 may be provided on each of the inner surface side of the top 151 and the inner surface side of the side wall of the housing 105, or provided on the inner surface side of the bottom surface of the housing 105. The example in which the thin plate 103 is provided at the position facing the semiconductor laser elements 101 has been explained. However, the thin plate 103 may be provided at a position facing the lenses 106, 107, and 108 and the optical filter 109. In this case, the number of thin plates 103 may be one or more.

The thin plate 103 is irradiated with the stray light or return light of the laser beam output from each of the semiconductor laser elements 101, and a portion covered with the thin plate 103 of the top 151 is not directly irradiated with the stray light or return light. That is, the thin plate 103 serves as a shield against irradiation with the stray light, return light, or the like, and heat generated by the light. It becomes difficult to heat the top 151 by the stray light, thereby suppressing a rise in temperature of the top 151. Since the portion covered with the thin plate 103 of the top 151 is not heated, extension, warp, expansion, or the like of the top 151 can be suppressed, thereby making it difficult to distort the whole housing 105.

The thin plate 103 may have a size to cover the whole top 151 or part of the top 151. Alternatively, the thin plate 103 may have a size to cover the plurality of semiconductor laser elements 101. In addition, the thin plate 103 may have a rectangular shape, a circular shape, a polygonal shape, or a shape obtained by combining some of these shapes.

The thin plate 103 may be made of metal, preferably aluminum (Al), copper (Cu), iron (Fe), or the like, but the present invention is not limited to them. Furthermore, the material of the thin plate 103 preferably has a thermal expansion coefficient smaller than that of the material of the top 151 or the housing 105.

FIG. 2A is a plan view showing the arrangement of the top 151 and thin plate 103 of the semiconductor laser module 100 according to this example embodiment. FIG. 2B is a partially enlarged side view showing the arrangement of the top 151 and thin plate 103 of the semiconductor laser module 100 according to this example embodiment.

As shown in FIGS. 2A and 2B, the thin plate 103 is arranged at the position to cover a portion from the center of the top 151 to its right side portion. The thin plate 103 has an area which covers about ⅔ of the area of the top 151 but the area of the thin plate 103 is not limited to this. For example, the area of the thin plate 103 may be equal to or smaller than that of the top 151.

Furthermore, the thin plate 103 has a rectangular shape, but the shape of the thin plate 103 is not limited to this. The thin plate 103 may have, for example, a circular shape, a polygonal shape, or a shape obtained by combining some or all of the rectangular shape, circular shape, and polygonal shape.

The thin plate 103 preferably has a thickness of 0.1 mm to 0.2 mm, but the thickness of the thin plate 103 is not limited to this.

The thin plate 103 is fixed to the top 151 by fixing portions 231. The thin plate 103 is fixed to the top 151 by, for example, adhering the fixing portions 231 using an adhesive (a thermosetting adhesive, an ultraviolet (UV) adhesive, or the like), or by screwing the fixing portions 231. For example, a rubber or resin adhesive or the like may be used as an adhesive, but the present invention is not limited to them. Furthermore, the thin plate 103 may be fixed to the top 151 by spot welding, YAG-welding, or the like. Alternatively, the thin plate 103 may be fixed to the top 151 by soldering or brazing, or using an adhesive tape. The two end portions of the thin plate 103 are folded to form folding portions 232. By providing the folding portions 232 at the two ends of the thin plate 103, the gap 131 is formed between the thin plate 103 and the top 151. Note that the folding portion 232 may be formed in one end portion of the thin plate 103.

Since the thin plate 103 is fixed to the top 151 by the two fixing portions 231, the heat of the thin plate 103 is difficult to be transferred to the top 151. Note that the thin plate 103 may be fixed to the top 151 by one fixing portion 231 or three or more fixing portions 231.

FIG. 2C is a partially enlarged side view showing an example of the arrangement of the thin plates of the semiconductor laser module according to this example embodiment. As shown in FIG. 2C, the two thin plates 103 may be arranged side by side. The number of thin plates to be arranged is not limited to two, and may be three or more.

FIG. 2D is a partially enlarged side view showing another example of the arrangement of the thin plate of the semiconductor laser module according to this example embodiment. The thin plate 103 may have a wavy shape when viewed from the side. As other examples, the thin plate 103 can have various shapes such as upward- and downward-convex shapes when viewed from, for example, the side of the semiconductor laser module 100 on which the optical fiber 102 is provided.

FIG. 2E is a partially enlarged side view showing still other example of the arrangement of the thin plate 103 of the semiconductor laser module according to this example embodiment. The thin plate 103 may have a curved shape when viewed from the side.

FIG. 2F is a plan view showing an example of the arrangement of the fixing portions of the thin plate of the semiconductor laser module according to this example embodiment. As shown in FIG. 2F, part of each fixing portion 231 may be removed. That is, part (a portion indicated by dotted lines in FIG. 2F) of each fixing portion 231 shown in FIG. 2A may be removed. In this case, the thin plate 103 is fixed to the top 151 by the four fixing portions 231.

FIG. 2G is a plan view showing another example of the arrangement of the fixing portions of the thin plate of the semiconductor laser module according to this example embodiment. As shown in FIG. 2G, the thin plate 103 may be fixed to the top 151 by the two fixing portions 231. In this case, the two fixing portions 231 are arranged at positions on a diagonal line but may be arranged at positions (one-dot dashed lines) facing each other.

According to this example embodiment, it is possible to suppress a variation in coupling ratio of output light from each semiconductor laser element to the optical fiber. In addition, since the thin plate serves as a shield against stray light or return light, and the top of the housing is not heated, the top of the housing is difficult to warp by heating, and the housing itself is difficult to be distorted, thereby suppressing a variation in coupling ratio to the optical fiber.

Second Example Embodiment

Figure 4:
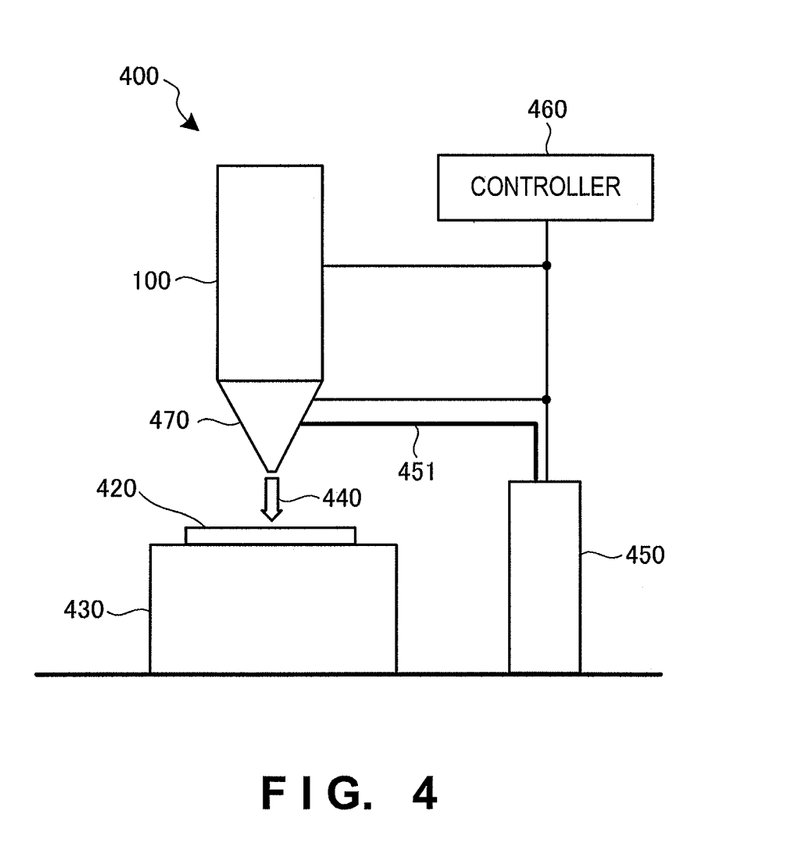
FIG. 4 is a view showing the arrangement of a three-dimensional laminating and shaping apparatus according to the second example embodiment of the present invention.

A three-dimensional laminating and shaping apparatus according to the second example embodiment of the present invention will be described next with reference to FIG. 4. FIG. 4 is a view for explaining the arrangement of a three-dimensional laminating and shaping apparatus 400 according to this example embodiment. Note that in FIG. 4, to avoid the view from becoming complicated, components other than those shown in FIG. 4 are not illustrated, as needed. Note also that an LMD (Laser Metal Deposition) type three-dimensional laminating and shaping apparatus will be exemplified as the three-dimensional laminating and shaping apparatus 400 but a powder bed type three-dimensional laminating and shaping apparatus may be adopted.

The three-dimensional laminating and shaping apparatus 400 is an apparatus for shaping a three-dimensional laminated and shaped object 420 on a shaping table 430 by melting and solidifying a metal powder or the like as a material of the three-dimensional laminated and shaped object by irradiating the metal powder with a laser beam, and laminating the metal powder.

As shown in FIG. 4, the three-dimensional laminating and shaping apparatus 400 includes a semiconductor laser module 100, the shaping table 430, a material storage 450, a material delivery tube 451, a controller 460, and a nozzle 470. The material storage 450, material delivery tube 451, and nozzle 470 form a material supplier.

The semiconductor laser module 100 serving as a light source generates a light beam such as a laser beam. The optical path of the generated laser beam is adjusted by the semiconductor laser module 100, a lens barrel (not shown), or the like, and the shaping table 430 is irradiated with the laser beam. The nozzle 470 ejects a carrier gas 440 from the distal end of the nozzle 470 to supply the material of the three-dimensional laminated and shaped object 420 onto the shaping table 430. The carrier gas 440 is an inert gas such as argon gas, nitrogen gas, or helium gas, and is a gas for conveying the metal powder or the like as the material of the three-dimensional laminated and shaped object 420 onto the shaping table 430. The material storage 450 stores the material of the three-dimensional laminated and shaped object 420, and supplies the material to the nozzle 470 via the material delivery tube 451 by force feed or the like.

The controller 460 is connected to the semiconductor laser module 100, material storage 450, and nozzle 470. The controller 460 controls the semiconductor laser module 100 to adjust and control the output energy, scanning direction, scanning speed, focusing state, and the like of the laser beam. Furthermore, the controller 460 controls the nozzle 470 and material storage 450 to adjust the scanning speed of the nozzle 470, the ejection amount of the carrier gas 440 from the nozzle 470, and the like, thereby adjusting the supply amount of the material.

According to this example embodiment, since a semiconductor laser module in which the coupling ratio of a laser beam does not lower is used, it is possible to shape a more accurate three-dimensional laminated and shaped object.

Other Example Embodiments

While the invention has been particularly shown and described with reference to example embodiments thereof, the invention is not limited to these example embodiments. It will be understood by those of ordinary skill in the art that various changes in form and details may be made therein without departing from the spirit and scope of the present invention as defined by the claims.

The invention claimed is:
1. A semiconductor laser module including
a plurality of semiconductor laser elements,
an optical fiber,
a condenser that condenses a laser beam emitted from each of said semiconductor laser elements to said optical fiber, and
a housing that implements said laser elements, said condenser, and said optical fiber,
the semiconductor laser module comprising:
at least one thin plate that is arranged on the top to form a gap for shielding heat by the laser beam with the top, wherein said thin plate includes a folding portion in at least one end portion, and is arranged on the top via said folding portion so that the gap is formed.

2. The semiconductor laser module according to claim 1, wherein said thin plate has a size to cover at least part of said semiconductor laser elements.

3. The semiconductor laser module according to claim 1, wherein said thin plate has a size to cover said plurality of semiconductor laser elements.

4. The semiconductor laser module according to claim 1, wherein said thin plate has one of a rectangular shape, a circular shape, and a polygonal shape.

5. The semiconductor laser module according to claim 1, wherein said thin plate has a thickness of 0.1 mm to 0.2 mm.

6. The semiconductor laser module according to claim 1, wherein said thin plate is made of aluminum.

7. A three-dimensional laminating and shaping apparatus using a semiconductor laser module defined in claim 1.

8. A semiconductor laser module including
a plurality of semiconductor laser elements,
an optical fiber,
a condenser that condenses a laser beam emitted from each of said semiconductor laser elements to said optical fiber, and
a housing that implements said laser elements, said condenser, and said optical fiber,
the semiconductor laser module comprising:
at least one thin plate that is arranged between said laser elements and a top of said housing, and arranged on the top to form a gap with the top,
said thin plate includes a folding portion in at least one end portion, and is arranged on the top via said folding portion,
said thin plate is provided at a position facing said semiconductor laser elements.

9. The semiconductor laser module according to claim 8, wherein said thin plate has a size to cover at least part of said semiconductor laser element.

10. The semiconductor laser module according to claim 8, wherein said thin plate has a size to cover said plurality of semiconductor laser elements.

11. The semiconductor laser module according to claim 8, wherein said thin plate has a size to cover said plurality of semiconductor laser elements,
said thin plate has one of a rectangular shape, a circular shape, and a polygonal shape.

12. The semiconductor laser module according to claim 8, wherein said thin plate has a size to cover at least part of the top,
said thin plate has a thickness of 0.1 mm to 0.2 mm.

13. The semiconductor laser module according to claim 8, wherein said thin plate has a size to cover said plurality of semiconductor laser elements,
said thin plate has one of a rectangular shape, a circular shape, and a polygonal shape,
said thin plate has a thickness of 0.1 mm to 0.2 mm.

* * * * *